United States Patent [19]

Johnson et al.

[11] 4,321,423
[45] Mar. 23, 1982

[54] HEAT SINK FASTENINGS

[75] Inventors: Philip A. Johnson, Kingston; Alfred F. McCarthy, Belmount, both of N.H.

[73] Assignee: Aavid Engineering, Inc., Laconia, N.H.

[21] Appl. No.: 149,971

[22] Filed: May 15, 1980

[51] Int. Cl.³ .............................................. H05K 7/20
[52] U.S. Cl. ............................ 174/16 HS; 361/386; 361/388
[58] Field of Search ................ 165/80 R, 80 B, 185; 174/16 HS; 357/81; 361/381, 383, 386–389, 399, 405

[56] References Cited

U.S. PATENT DOCUMENTS

| | | | |
|---|---|---|---|
| 3,222,580 | 12/1965 | Curll, Jr. | 174/35 TS |
| 3,247,896 | 4/1966 | Chu | 361/383 |
| 3,465,212 | 9/1969 | Grimes | 357/81 |
| 3,572,428 | 3/1971 | Monaco | 361/383 |
| 3,859,570 | 1/1975 | Veranth | 361/386 |
| 4,012,769 | 3/1977 | Edwards | 357/81 |
| 4,103,321 | 7/1978 | Gansert | 361/388 |

OTHER PUBLICATIONS

Transistor Retainer and Heat Dissipator, IERC, New Product, p. 126, 8/10/60, Burbank, CA.

Primary Examiner—Gerald P. Tolin
Attorney, Agent, or Firm—James E. Mrose

[57] ABSTRACT

Auxiliary heat-sink attachments which promote dissipation of heat from electronic solid-state devices and the like are secured with such devices and with associated printed-circuit boards by way of accessory fastenings with which they form a sub-assembly wave-solderable in pre-spaced relation to the board.

4 Claims, 5 Drawing Figures

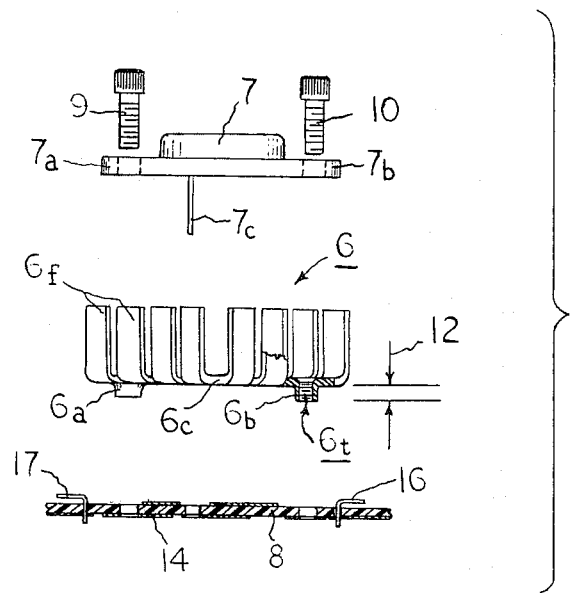
FIG. 1
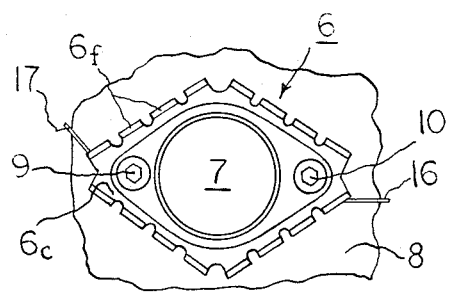
FIG. 2
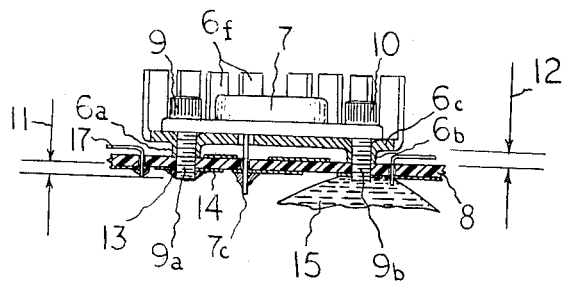
FIG. 3
FIG. 4
FIG. 5
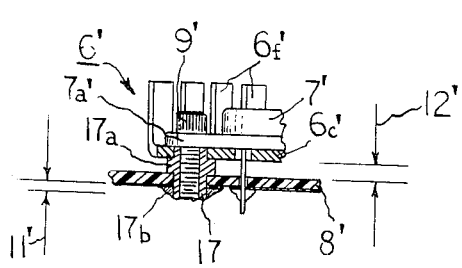
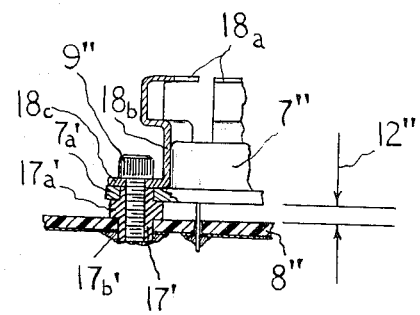

HEAT SINK FASTENINGS

BACKGROUND OF THE INVENTION

The present invention relates to improvements in the fastening of heat sinks both with electronic components and with printed circuit boards, and, in one particular aspect, to unique and advantageous combinations of semiconductor devices, or the like, with auxiliary heat sinks by way of fastening provisions which unite them as readily-processed sub-assemblies and afford wave-solderable surfaces and spacings for convenient mountings on and connections with printed-circuit boards.

Miniature electronic semiconductor devices and circuit modules cannot be responsibly designed into power-handling applications beyond those in which they can successfully expel and prevent excessive build-up of self-generated heat. However, the uses of standard low-cost forms of such items often can nevertheless be significantly extended and enlarged with the aid of small finned metal extrusions or stampings which will adequately conduct and radiate heat away from their thermally-vulnerable regions. Commonly, such heat-sinked items must also be integrated into mechanical and electrical associations with other components, and with electrically-conductive paths, which are disposed on or as part of printed circuitry wherein a relatively sturdy stiff or somewhat flexible insulating "board" or sheet serves as the base or mount. In those instances, economic considerations tend to suggest that use of the heat sinks preferably ought not to complicate or delay or compound the soldering, and that there should be as little as possible of operator involvement and of the handling of separate parts. Moreover, the heat-sinking provisions should be mountable to avoid unintended mechanical, thermal and electrical interactions with the printed circuitry and components.

It has been a well-known practice to spring-clip miniature heat sinks onto small semiconductor devices (U.S. Pat. Nos. 3,572,428 and 4,012,769) and such devices have commonly been soldered securely into place, via their electrical leads, on printed-circuit boards, with their heat sinks clipped on top (U.S. Pat. No. 3,247,896). Further, a tab from such a heat sink has been utilized to make a separate soldered connection with the board, and to promote thermal and electrical contacting (U.S. Pat. No. 3,222,580). In other instances, heat sinks have been bolted to the flanges of semiconductor devices, and it has also been known to stake solderable threaded studs to the heat sinks so that they might at one end be fixed with such devices by way of a nut and then be soldered to printed circuit boards at their opposite ends.

SUMMARY OF THE INVENTION

The present invention is aimed at creating heat-sink fastenings which offer improvements in respect of ease and simplicity in use, economies in manufacture and installation, and isolations from unwanted thermal and electrical interactions with circuit boards. In one preferred embodiment, a stamped heavy-gage sheet-metal heat sink, of a material such as aluminum which does not lend itself to wetting by conventional soldering, is pre-assembled in intimate heat-transfer relationship with a semiconductor device with the aid of a threaded bolt which projects through and below the base of the heat sink where it is threadedly engaged within a spacer element of a predetermined height which will act to preserve the base of the heat sink in a desired stand-off relation to an underlying printed-circuit board. A bolt which is of readily-wetted material and which projects below the spacer element and through the board may itself serve to connect the pre-assembled sink and semiconductor combination to the board, when the latter is wave-soldered from below with the combination in place. A bolt which is not of such material may instead have its lower end threadedly capped by a member which is of such material, and such a cap member may incorporate the spacer as an integral part thereof at its upper end. The spacer elements may in other versions be integral portions of the heat-sink base, either as dimpled or tab-like downward projections or as boss-like sleeves for the through-bolts, preferably with internal threading for mating with the bolts.

Accordingly, it is one of the objects of this invention to provide novel and improved sub-assembling provisions whereby semiconductor devices and the like may be readily and economically equipped with heat sinks promoting their wave-soldered attachments in spaced relation to printed-circuit boards.

A further object is to provide unique and advantageous fastenings of simple low-cost form by which heat sinks may be readily combined with electronic components and integral spacer provisions to produce assemblies which may be mechanically secured to printed circuit boards in spaced relation while they undergo their usual wave soldering.

BRIEF DESCRIPTION OF THE DRAWINGS

Although the aspects of this invention which are considered to be novel are expressed in the appended claims, further details as to preferred practices and as to further objects and and features thereof may be most readily comprehended through reference to the following detailed description when taken in connection with the accompanying drawings, wherein:

FIG. 1 is side view of parts, in an "exploded" relationship, which are to be joined to form an improved wave-soldered spaced mounting of a heat sink and encased semiconductor with a printed-circuit board in accordance with one practice of this invention, a portion of the heat sink being broken away to expose structural details;

FIG. 2 provides a top pictorial view of the same parts, fully assembled;

FIG. 3 is a partly cross-sectioned side view of the same parts, assembled, as the board undergoes wave-soldering;

FIG. 4 illustrates a cross-sectioned fragment of another assembly of a heat sink and semiconductor device, in which the spacer and wettable fastener are portions of a bolt cap; and FIG. 5 depicts the improved fastening of a heat sink which overlies rather than underlies the component being cooled, from the side, and with portions of the assembled items being broken away and cross-sectioned for better expression of the structural relationships.

DETAILED DESCRIPTION OF THE PREFERRED EMBODIMENTS

Having reference to the drawings, wherein like reference characters designate like or identical or corresponding parts throughout the different views, and more particularly to FIGS. 1 through 3 thereof, one expression of the improved fastening of a heat sink 6 and an electronic component 7 with a printed circuit board 8 makes use of a pair of bolts 9 and 10 which are of sufficient length to extend fully through the respective component flanges 7a and 7b, and fully through the base 6c and bosses 6a and 6b of the heat sink, and fully through the board 8, and to have their lower ends depend below the board for a further distance, 11 (FIG. 3), which allows them to be "wet" by and bonded with solder applied from below. The component 7 is there represented as a semiconductor device having a known "TO-3" style of metal case including a capped relatively massive base exhibiting the aforementioned apertured flanges 7a and 7b, and the associated heat sink 6 is shown as one having its substantially planar base 6c in underlying abutted relation to that device and having a plurality of elongated tab-like integral fins 6f projecting upwardly from about its margins. The heat sink base 6c is apertured at appropriate positions, to allow component leads, such as 7c, to pass through it without unintended electrical contacting, and it is further apertured so as accommodate the bolts 9 and 10. However, although it has been a known prior practice to employ conventional nuts and bolts, or staked bolts and cooperating nuts, to secure a heat sink and electronic device together, the bolts 9 and 10 in the arrangement under discussion are fashioned of electrically conductive material which lends itself to solder "wetting" or "tinning", and are also preferably well tinned before being secured in place. Moreover, the base 6c of the heat sink is fashioned with the integral depending bosses 6a and 6b, both of which are internally threaded, as at 6t (FIG. 1), with threading complementary to the external threading of the bolts 9 and 10. Both bosses are struck and/or trimmed to a predetermined depending height 12 which will preserve an important spacing between the bottom of the heat sink and the top surfaces and upper leads of the printed-circuit board with which it is to be associated.

Heat sink 6 is initially combined with device 7 in a self-sustaining sub-assembly, by tightly threading bolts 9 and 10 through the tapped bosses 6a and 6b, with the flanges of device 7 appropriately trapped between the enlarged bolt heads and the top of base 6c. With the thus-tightened elongated wettable and/or pre-tinned bolts extending well below those bosses, the sub-assembly is mounted atop the board 8, at an intended site where there are pre-formed openings which will accommodate passage of the leads, 7c, and threaded bolt shanks freely through them, but not the enlarged bosses 6a and 6b. As may be seen in FIG. 3, the bosses thus maintain the desired spacing, 12, with the lowermost ends 9a and 9b of the bolts projecting below the board 8 for the distance 11, sufficient to allow and promote the collection of small masses of solder, such as 13, which will anchor the bolts in place, and make electrical connection with any lower board cladding, such as 14, which may be disposed there for that purpose by appropriate patterning of the etched circuitry. Molten solder wave 15 will coat and leave deposits on exposed wettable bottom surfaces and projections as the board with the top-mounted sub-assembly and other components (not shown) undergoes relative motion from right to left in FIG. 3. Component and connection leads, such as 16 and 17, will be safely cleared as the result of the spacing 12. That spacing, even when only of the order of 1/16 inch, will further insure that no capillary-size spaces can exist between the board and heat sink to attract and draw molten solder into them and, thereby, to invite unwanted electrical shorting of circuit paths atop the board and undue troublesome conduction of heat to the board.

The embodiment expressed in FIG. 4 involves some similar parts and relationships, which are therefore conveniently designated by the same reference characters as those appearing in FIGS. 1–3, with distinguishing single-prime accents being added. There, the spacing 12' is achieved by way of an enlarged integral shoulder 17a of a separate internally-threaded cap 17 for the bolt 9', rather than by any integral boss depending from the heat sink. Bolt 9' need not be of solder-wettable material, or tinned, and its threaded shank length need only suffice to secure it in tight holding relationship within the shouldered cap 17 with the device flange 7a' held against the top of the heat sink base 6c'. Importantly, the internally-threaded elongated cap 17 exhibits at least a lower outer surface which is solder-wettable, and preferably is pre-tinned. A sub-assembly of device 7' and heat sink 6' is first prepared, by bolting the device onto the heat-sink base, by way of threadedly mating the bolts, such as 9', with the cooperating elongated caps, such as 17, such that the device flange and heat-sink base are disposed between the shoulder 17a and enlarged top of the bolt. With each elongated cap extending through and below the board by a distance 11', the lower board surfaces and depending projections are next wave-soldered in generally conventional fashion, and the lower end of each cap 17 is thereby covered by a solidified solder deposit 17b which makes intended mechanical and electrical bonds. At the same time, shoulders such as 17a preserve the desired spacing 12' atop the board, to realize advantages such as those already discussed hereinabove.

A like elongated cap 17', with an integral spacer-shoulder 17a', is employed with the bolt-type fastener 9" appearing in FIG. 5. There, the heat-sinking for the packaged electronic device, 7", is achieved with the aid of an overlying crown-like array of fingers 18a upstanding from a cylindrical band 18b which is fitted about the central body of the device, the latter having laterally-extending apertured flanges, such as 18c, which lie atop and in coextensive and abutting relationship with the apertured flanges, such as 7a", of the base of the device. Shoulder 17a' predetermines the desired spacing, 12", between the top of the circuit board 8" and the lower surfaces of the base of device 7". The sub-assembly which is prepared beforehand, for later mounting upon board 8", is in this instance developed by placing the crown-like array over the central cap of device 7", with the apertures in the abutting flanges 7a" and 18c aligned, and then mating the bolt 9" threadedly with the elongated cap 17". This fastens the flanges together and positions the downwardly-depending solder-wettable cap so that it may be rested upon the circuit board with its lower end projecting below to enable formation of the intended wave-soldered joint 17b'.

Bolts 9' and 9" may be but need not be of solder-wettable or tinned construction, and their enlarged upper ends may be provided with tool-receiving sockets or slots, or may be shaped as fixed or removable nuts. The shouldered caps 17 and 17' are also preferably fashioned with upper ends of lesser diameter fitting rather tightly within the accommodating apertures in either the cooperating base of a heat sink (FIG. 4) or the cooperating base of an electronic device (FIG. 5). The latter type of tight fit aids in holding the parts together while the sub-assembly is being readied, and, in a modification, such elements may be staked in a tight anchoring with the base of a heat sink. Where spacing from the circuit board would be more appropriately effected at sites other than those where the bolts or capped bolts are located, the heat sink base may be suitably indented or formed with downwardly-struck tabs at those sites. More than two such bolts or capped bolts may be used with some devices, and, particularly with very small devices, the correspondingly miniature-sized heat sinks may each be mounted and spaced with use of but one such fastening arrangement. It should therefore be understood that the specific embodiments and practices shown and described herein have been presented by way of disclosure, rather than limitation, and that various modifications, combinations and substitutions may be effected by those skilled in the art without departure in spirit or scope from this invention in its broader aspects and as set forth in the appended claims.

What we claim as new and desire to secure by Letters Patent of the United States is:

1. Heat sink apparatus fastenable in a subassembly relationship with a packaged electronic device having an apertured heat-conducting base, for wave-soldered attachment in spaced relation to a printed-circuit board, comprising a metal heat-sink member having an apertured base adapted to fit in abutting aperture-aligned relation with the heat-conducting base of a packaged electronic device, externally-threaded elongated fastener means proportioned to fit through apertures of the base of the heat-sink member and apertures of base of a packaged electronic device and to hold the base of the heat-sink member joined togethe with and in underlying relation to such a device, said threaded fastener means projecting below said base by a predetermined distance which is not less than the thickness of a printed-circut with which it is intended to be fastened plus the further thickness of a desired spacing between said base and the top of such a printed-circuit board, spacer means in the form of integral hollow cylindrical bosses of material about said apertures and projecting below said base by a distance equal to said further thickness and disposed to rest upon top surfaces of such a printed-circuit board to effect the spacing, said bosses being internally threaded for mating with said externally-threaded fastener means, the threaded surfaces of said fastener means which project through such a printed-circuit board when the spacer means rest upon the top surfaces of such a printed-circuit board being wettable by molten solder to collct and bond with a quantity of solder upon exposure of lower surfaces of the board to wave-soldering.

2. Heat-sink apparatus fastenable in a sub-assembly relationship with a packaged electronic device having an apertured heat-conducting base for wave-soldered attachment in spaced relation to a printed-circuit board, comprising a metal heat-sink member having an apertured base adapted to fit in abutting aperture-aligned relation with the heat-conducting base of a packaged electronic device, elongated fastener means externally threaded along an upper section and proportioned to fit through apertures of the base of the heat-sink member and apertures of the base of a packaged electronic device and hold said base of said heat-sink member joined together in abutting relationship with the base of such a device, said fastener means having an internally-threaded lower section receiving the threaded upper section therein in mated relationship, said lower section having external surfaces wettable by molten solder, said lower section of said elongated fastener means projecting below said base of said heat-sink member and the base of such a device which may be abutted therewith by a predetermined distance which is not less than the thickness of such a printed-circuit board plus the further thickness of a desired spacing between the top of such a printed-circuit board and the abutted base of said heat-sink member and the base of such a device which may be abutted therewith, and spacer means projecting below the abutted base of said heat-sink member and the base of such a device which may be abutted therewith by a distance equal to said further thickness and disposed to rest upon top surfaces of such a printed-circuit board to effect the spacing, the surfaces of said lower section which project through such a printed-circuit board when the spacer means rest upon the top surfaces of such a printed-circuit board collecting and bonding with a quantity of solder upon exposure of lower surfaces of such a printed-circuit board to wave-soldering.

3. Heat-sink apparatus as set forth in claim 2 wherein said spacer means comprises an integral enlarged-diameter shoulder of said lower section of said fastening means.

4. Heat-sink apparatus as set forth in claim 2 wherein said upper section of said fastener means comprises a bolt threadedly mated within said lower section thereof to hold said base of said heat-sink member in abutting relationship with the base of such a packaged electronic device which may be abutted therewith.

* * * * *